(12) United States Patent
Heun et al.

(10) Patent No.: US 8,580,395 B2
(45) Date of Patent: *Nov. 12, 2013

(54) ELECTROLUMINESCENT POLYMERS, METHOD FOR THE PRODUCTION THEREOF, AND USE THEREOF

(75) Inventors: Susanne Heun, Bad Soden (DE); Aurélie Ludemann, Frankfurt (DE); Rémi Manouk Anemian, Frankfurt (DE); Niels Schulte, Kelkheim (DE)

(73) Assignee: Merck Patent GmbH (DE)

( * ) Notice: Subject to any disclaimer, the term of this patent is extended or adjusted under 35 U.S.C. 154(b) by 143 days.

This patent is subject to a terminal disclaimer.

(21) Appl. No.: 13/002,055

(22) PCT Filed: Aug. 4, 2009

(86) PCT No.: PCT/EP2009/005639
§ 371 (c)(1),
(2), (4) Date: Dec. 30, 2010

(87) PCT Pub. No.: WO2010/022847
PCT Pub. Date: Mar. 4, 2010

(65) Prior Publication Data
US 2011/0108824 A1    May 12, 2011

(30) Foreign Application Priority Data
Aug. 29, 2008  (DE) .................. 10 2008 044 868

(51) Int. Cl.
*H01L 51/54*    (2006.01)

(52) U.S. Cl.
USPC ........... 428/690; 313/504; 313/505; 313/506; 257/40; 257/E51.05; 257/E51.026; 257/E51.032; 548/440

(58) Field of Classification Search
USPC .......... 548/440; 428/690, 917; 313/504, 505, 313/506; 257/40, E51.05, E51.026, 257/E51.032
See application file for complete search history.

(56) References Cited

U.S. PATENT DOCUMENTS

| | | | |
|---|---|---|---|
| 5,807,974 A | 9/1998 | Kim et al. | |
| 5,874,179 A | 2/1999 | Kreuder et al. | |
| 6,956,095 B2 | 10/2005 | Treacher et al. | |
| 6,994,893 B2 | 2/2006 | Spreitzer et al. | |

(Continued)

FOREIGN PATENT DOCUMENTS

| DE | 10116962 A1 | 10/2002 |
|---|---|---|
| DE | 10238903 A1 | 3/2004 |

(Continued)

OTHER PUBLICATIONS

Luo et. al., Novel p-phenylene-vinylene-dithienylene type copolymer: potential red-emitting materials, 2004, Synthetic Metals, vol. 145, pp. 67-73.*

(Continued)

*Primary Examiner* — Gregory Clark
(74) *Attorney, Agent, or Firm* — Novak Druce Connolly Bove + Quigg LLP

(57) ABSTRACT

The present invention relates to electroluminescent polymers which comprise 2-vinylthiophenylbenzene derivatives as recurring units, to a process for the preparation thereof, to blends and formulations comprising these polymers, and to the use of these polymers in electronic devices, in particular in organic light-emitting diodes, so-called OLEDs.

10 Claims, 3 Drawing Sheets

(56) References Cited

U.S. PATENT DOCUMENTS

| | | |
|---|---|---|
| 7,094,897 B2 | 8/2006 | Stossel et al. |
| 7,125,998 B2 | 10/2006 | Stossel et al. |
| 7,252,781 B2 | 8/2007 | Spreitzer et al. |
| 7,288,617 B2 | 10/2007 | Treacher et al. |
| 7,323,533 B2 | 1/2008 | Becker et al. |
| 7,405,255 B2 | 7/2008 | Spreitzer et al. |
| 7,534,853 B2 | 5/2009 | Stossel et al. |
| 7,638,594 B2 | 12/2009 | Becker et al. |
| 7,659,540 B2 | 2/2010 | Heun et al. |
| 7,696,284 B2 | 4/2010 | Falcou et al. |
| 7,723,455 B2 | 5/2010 | Becker et al. |
| 7,745,627 B2 | 6/2010 | Stossel et al. |
| 7,767,785 B2 | 8/2010 | Falcou et al. |
| 7,772,323 B2 | 8/2010 | Becker et al. |
| 7,834,136 B2 | 11/2010 | Parham et al. |
| 7,883,785 B2 | 2/2011 | Stossel et al. |
| 7,910,687 B2 | 3/2011 | Busing et al. |
| 2004/0166366 A1 | 8/2004 | Cho et al. |
| 2005/0263758 A1 | 12/2005 | Treacher et al. |
| 2006/0058494 A1 | 3/2006 | Busing et al. |
| 2006/0199943 A1* | 9/2006 | Falcou et al. ............ 528/422 |
| 2006/0229427 A1 | 10/2006 | Becker et al. |
| 2006/0284140 A1 | 12/2006 | Breuning et al. |
| 2007/0154732 A1 | 7/2007 | Kitano et al. |
| 2007/0205714 A1 | 9/2007 | Busing et al. |
| 2007/0290194 A1 | 12/2007 | Becker et al. |
| 2009/0321686 A1 | 12/2009 | Buesing et al. |
| 2010/0102305 A1 | 4/2010 | Heun et al. |
| 2010/0197875 A1 | 8/2010 | Falcou et al. |
| 2011/0068304 A1 | 3/2011 | Parham et al. |

FOREIGN PATENT DOCUMENTS

| | | |
|---|---|---|
| DE | 10249723 A1 | 5/2004 |
| DE | 10304819 A1 | 8/2004 |
| DE | 10328627 A1 | 2/2005 |
| DE | 10337346 A1 | 3/2005 |
| DE | 10343606 A1 | 4/2005 |
| DE | 10349033 A1 | 5/2005 |
| DE | 10350606 A1 | 6/2005 |
| DE | 102006035041 A1 | 1/2008 |
| EP | 1239526 A2 | 9/2002 |
| JP | 10-506426 | 6/1998 |
| JP | 2005500429 A | 1/2005 |
| JP | 2007525564 A | 9/2007 |
| WO | WO-00/46321 A1 | 8/2000 |
| WO | WO-02/067343 A1 | 8/2002 |
| WO | WO-02/068435 A1 | 9/2002 |
| WO | WO-02/072714 A1 | 9/2002 |
| WO | WO-02/077060 A1 | 10/2002 |
| WO | WO-02/081488 A1 | 10/2002 |
| WO | WO-03/016430 A1 | 2/2003 |
| WO | WO-03/019694 A2 | 3/2003 |
| WO | WO-03/020790 A2 | 3/2003 |
| WO | WO-03/048225 A2 | 6/2003 |
| WO | WO-2004/026886 A2 | 4/2004 |
| WO | WO-2004/037887 A2 | 5/2004 |
| WO | WO-2004/070772 A2 | 8/2004 |
| WO | WO-2004/113468 A1 | 12/2004 |
| WO | WO-2005/014688 A2 | 2/2005 |
| WO | WO-2005/014689 A2 | 2/2005 |
| WO | WO-2005/026144 A1 | 3/2005 |
| WO | WO-2005/030827 A1 | 4/2005 |
| WO | WO-2005/030828 A1 | 4/2005 |
| WO | WO-2005/040302 A1 | 5/2005 |
| WO | WO-2005/042548 A1 | 5/2005 |
| WO | WO-2005/083812 A2 | 9/2005 |
| WO | WO-2005/104264 A1 | 11/2005 |
| WO | WO-2008/011953 A1 | 1/2008 |

OTHER PUBLICATIONS

Hou, J., et al., "Synthesis and absorption of poly(3-(phenylenevinyl)thiophene)s with conjugated side chains," Macromolecules 2006, vol. 39, pp. 594-603.

Hwang, D.-H., et al., "Band gap tuning of new light emitting conjugated polymers," Optical Materials 2002, vol. 21, pp. 199-203.

Saito, H., et al., "Synthesis of soluble poly(arylenevinylene) carrying various heterocycles as arylene units," Macromolecules 1995, vol. 28, pp. 8363-8367.

Wagner, P., et al. "Synthesis and characterization of novel styryl-substituted oligothienylenevinylese," Tetrahedron 2006, vol. 62, pp. 2190-2199.

Watanabe, Y., et al., "Synthesis and physical properities of side-chain type liquid crystalline poly(arylenevinylese)s," Macromolecules 1997, vol. 30, pp. 1857-1859.

Xue, C., et al., "Novel p-phenylene-vinylene-dithienylene type copolymer: potential red-emitting materials," Synthetic Metals 2004, vol. 145, pp. 67-73.

Lee et al., "Emission color tuning of new fluorene-based alternating copolymers containing low band gap dyes", Synthetic Metals, vol. 155, No. 1, pp. 73-79, 2005.

Office Action of corresponding Japanese Patet Application No. 2011-524219 dated Aug. 6, 2013.

* cited by examiner

ELECTROLUMINESCENT POLYMERS, METHOD FOR THE PRODUCTION THEREOF, AND USE THEREOF

CROSS-REFERENCE TO RELATED APPLICATIONS

This application is a national stage application (under 35 U.S.C. §371) of PCT/EP2009/005639, filed Aug. 4, 2009, which claims benefit of German application 10 2008 044 868.0, filed Aug. 29, 2008.

BACKGROUND OF THE INVENTION

The present invention relates to electroluminescent polymers which comprise 0.01 to 100 mol % of one or more structural units of the formula (I) and/or (II), to a process for the preparation thereof, to blends and formulations comprising these polymers, and to the use of these polymers in electronic devices, in particular in organic light-emitting diodes, so-called OLEDs. The polymers according to the invention exhibit improved efficiency and a longer lifetime, in particular on use in OLEDs.

Conjugated polymers have already been investigated intensively for a long time as highly promising materials in OLEDs. OLEDs which comprise polymers as organic materials are frequently also known as PLEDs (PLED=polymer light-emitting diode). Their simple preparation promises inexpensive production of corresponding light-emitting diodes.

Since PLEDs usually only consist of one light-emitting layer, polymers are required which are able as far as possible to combine all functions (charge injection, charge transport, recombination) of an OLED in themselves. In order to meet these requirements, different monomers which take on the corresponding functions are employed during the polymerisation. Thus, it is generally necessary, for the generation of all three emission colours, to copolymerise certain comonomers into the corresponding polymers (cf., for example, WO 00/46321 A1, WO 03/020790 A2 and WO 02/077060 A1). Thus, it is possible, for example, starting from a blue-emitting base polymer ("backbone"), to generate the other two primary colours red and green.

Various classes of material, such as, for example, poly-para-phenylenes (PPPs), have already been proposed or developed as polymers for full-colour display elements (full-colour displays). Thus, for example, polyfluorene, polyspirobifluorene, polyphenanthrene, polydihydrophenanthrene and polyindenofluorene derivatives come into consideration. Polymers which comprise a combination of the said structural elements have also already been proposed.

The most important criteria of an OLED are efficiency, colour and lifetime. Since these properties are crucially determined by the emitter(s) used, improvements in the emitters compared with the materials known from the prior art continue to be required.

In particular, the lifetime of green- and especially blue-emitting polymers is not yet ideal for many applications. The same applies to the efficiency of red-emitting polymers.

WO 2005/030827 A1 discloses polymers which emit white light. Green-emitting comonomers proposed here are, inter alia, vinylarylene units of the following general formula:

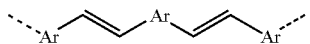

in which Ar is an optionally substituted, aromatic or heteroaromatic ring system. These units should comprise at least one electron-rich ring system Ar or ring system Ar which has electron-rich substituents, such as, for example, thiophene, furan, pyrrole, or phenyl which is substituted by alkoxy, aryloxy or amino groups. The specific examples of WO 2005/030827 A1 disclose a monomer of the following formula:

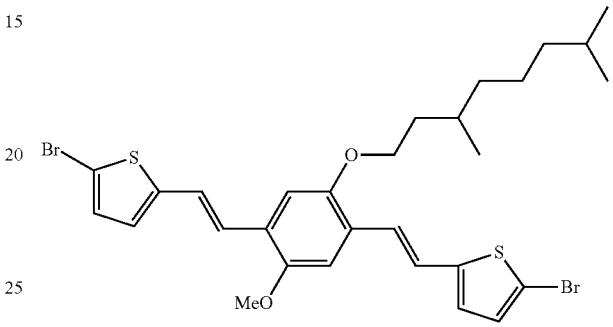

containing two thiophene-2,5-diyl groups and one 1,4-dialkoxyphenyl group.

With respect to shorter wavelengths, vinylarylene compounds from the prior art only enable the preparation of green emitter units, which in addition exhibit a shift in the emission colour to yellow on use of relatively high concentrations in the polymer. Other colours, especially blue, cannot be achieved with the emitters known from the prior art. In addition, the emitters from the prior art exhibit increased oxidation sensitivity in solution and are therefore difficult to purify.

BRIEF SUMMARY OF THE INVENTION

One of the objects of the present invention was therefore to provide electroluminescent polymers which have improved efficiency and a longer lifetime and especially also facilitate a blue emission colour in the polymer. This object is achieved in accordance with the invention by the provision of electroluminescent polymers which comprise 0.01 to 100 mol % of one or more structural units of the formula (I) and/or (II).

Surprisingly, it has been found that the electroluminescent polymers comprising structural units of the formula (I) and/or (II) have very good properties. In particular, they exhibit very high efficiencies and increase the lifetime by several orders of magnitude compared with reference systems to date. The novel structural units are particularly suitable as emitter, but also, depending on the substitution pattern, as polymer backbone, hole conductor or electron conductor.

The present invention thus relates to polymers comprising 0.01 to 100 mol %, preferably 0.01 to 50 mol %, particularly preferably 0.1 to 25 mol %, of one or more structural units of the formula (I) and/or (II):

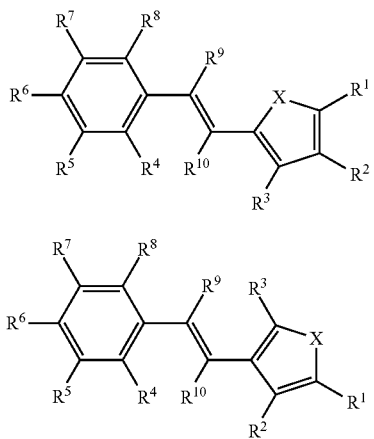

where the symbols and indices used have the following meanings:

$R^1$ to $R^{10}$ are, independently of one another, identically or differently, H, halogen (F, Cl, Br, I), —CN, —NO$_2$, —NCS, —NCO, —OCN, —SCN, —SF$_5$, —Si(R)$_3$ or a straight-chain, branched or cyclic alkyl or alkoxy group having 1 to 22 C atoms, in which, in addition, one or more non-adjacent C atoms may be replaced by —C(R)=C(R)—, —C≡C—, —N(R)—, —O—, —S—, —CO—, —CO—O—, —O—CO— or —O—CO—O—, where, in addition, one or more H atoms may be replaced by fluorine, an aryl, aryloxy, heteroaryl or heteroaryloxy group having 5 to 40 C atoms, which may also be substituted by one or more non-aromatic radicals $R^{1-10}$, where, in addition, two or more radicals, preferably adjacent radicals, of the radicals $R^{1-10}$ may form with one another an aliphatic or aromatic, mono- or polycyclic ring system, which may also form a condensed ring system with the benzene ring or the thiophene ring in the formula (I) or (II), R is on each occurrence, identically or differently, H, halogen, a straight-chain, branched or cyclic alkyl chain having 1 to 22 C atoms, in which, in addition, one or more non-adjacent C atoms may be replaced by —O—, —S—, —CO—, —CO—O—, —O—CO— or —O—CO—O—, where, in addition, one or more H atoms may be replaced by fluorine, an aryl, aryloxy, heteroaryl or heteroaryloxy group having 5 to 40 C atoms, which may also be substituted by one or more non-aromatic radicals $R^{1-10}$, where, in addition, two or more radicals R may form with one another and/or with further radicals $R^{1-10}$ an aromatic or aliphatic, mono- or polycyclic ring system, which may also form a condensed ring system with the benzene ring or the thiophene ring in the formula (I) or (II), X is S or O, preferably S, and in which at least one of the radicals $R^1$ to $R^{10}$ denotes a link in the polymer.

A BRIEF DESCRIPTION OF THE FIGURES

DETAILED DESCRIPTION OF THE INVENTION

Figure 1:
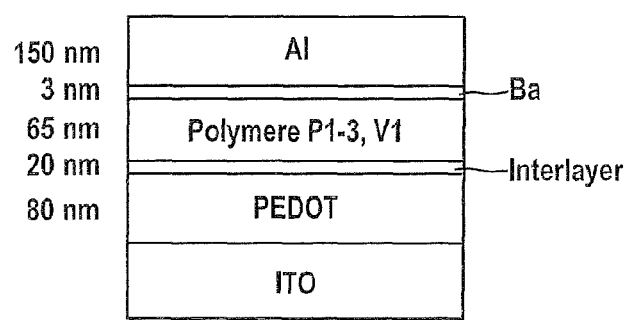
FIG. 1 illustrates the structure of a typical device according to the invention.

In a preferred embodiment, the polymer comprises 0.01 to 50 mol % of one or more structural units of the formula (I) or (II), particularly preferably 0.01 to 50 mol % of a structural unit of the formula (I) or (II) and in particular 0.01 to 50 mol % of a structural unit of the formula (I).

In a further preferred embodiment, one, two, three or four, preferably one, two or three, of the radicals $R^1$ to $R^{10}$ denote a link in the polymer, particularly preferably two of the radicals $R^1$ to $R^{10}$ denote a link in the polymer.

If two of the radicals $R^1$ to $R^{10}$ denote a link in the polymer, it is preferred for one of the radicals $R^1$ to $R^3$ to denote a link in the polymer and one of the radicals $R^4$ to $R^8$ to denote a link in the polymer. Particularly preferably, the two radicals $R^1$ and $R^6$ denote the link in the polymer.

In the present application, the term polymer is taken to mean both polymeric compounds, oligomeric compounds and dendrimers. The polymeric compounds according to the invention preferably have 10 to 10,000, particularly preferably 20 to 5000 and in particular 50 to 2000 recurring units. The oligomeric compounds according to the invention preferably have 2 to 9 recurring units. The branching factor of the polymers here is between 0 (linear polymer, no branching points) and 1 (fully branched dendrimer).

The polymers according to the invention are either conjugated, partially conjugated or non-conjugated polymers. Conjugated or partially conjugated polymers are preferred.

The structural units of the formula (I) and/or (II) can, in accordance with the invention, be incorporated into the main chain or into the side chain of the polymer. On incorporation into the side chain, it is possible for the structural units of the formula (I) and/or (II) to be conjugated with the main polymer chain or for them to be non-conjugated with the main polymer chain. The structural units of the formula (I) and/or (II) are preferably incorporated into the main chain of the polymer.

"Conjugated polymers" in the sense of the present application are polymers which contain principally sp$^2$-hybridised (or optionally also sp-hybridised) carbon atoms in the main chain, which may also be replaced by corresponding heteroatoms. In the simplest case, this means the alternating presence of double and single bonds in the main chain, but also polymers comprising units such as, for example, meta-linked phenylene are intended to be regarded as conjugated polymers in the sense of this application. "Principally" means that naturally (involuntarily) occurring defects which result in conjugation interruptions do not devalue the term "conjugated polymer". Furthermore, the term conjugated is likewise used in this application if, for example, arylamine units, arylphosphine units, certain heterocycles (i.e. conjugation via N, O or S atoms) and/or organometallic complexes (i.e. conjugation via the metal atom) are located in the main chain. An analogous situation applies to conjugated dendrimers. By contrast, units such as, for example, simple alkyl bridges, (thio)ether, ester, amide or imide links are clearly defined as non-conjugated segments. A partially conjugated polymer in the sense of the present application is intended to be taken to mean a polymer which contains conjugated regions which are separated from one another by non-conjugated sections, specific conjugation interrupters (for example spacer groups) or branches, for example in which relatively long conjugated sections in the main chain are interrupted by non-conjugated sections, or which contains relatively long conjugated sections in the side chains of a polymer which is non-conjugated in the main chain. Conjugated and partially conjugated polymers may also comprise conjugated, partially conjugated or other dendrimers.

The term "dendrimer" in the present application is intended to be taken to mean a highly branched compound built up from a multifunctional centre (core) to which branched monomers are bonded in a regular structure, giving a tree-like structure. Both the centre and the monomers here may adopt any desired branched structures which consist both of purely organic units and also organometallic compounds or coordination compounds. "Dendrimer" here is generally intended to be understood as described, for example, by M. Fischer and F. Vögtle (*Angew. Chem., Int. Ed.* 1999, 38, 885).

In a further preferred embodiment of the present invention, units of the formula (I) and/or (II) are conjugated with the main polymer chain. This can be achieved on the one hand by these units being incorporated into the main chain of the polymer in such a way that the conjugation of the polymer, as described above, is thereby retained. On the other hand, these units can also be linked into the side chain of the polymer in such a way that conjugation with the main chain of the polymer exists. This is the case, for example, if the linking to the main chain takes place only via $sp^2$-hybridised (or optionally also via sp-hybridised) carbon atoms, which may also be replaced by corresponding heteroatoms. However, if the linking takes place through units such as, for example, simple (thio)ether bridges, esters, amides or alkylene chains, the units of the formula (I) and/or (II) are defined as non-conjugated with the main chain.

The conjugated, partially conjugated or non-conjugated polymers and dendrimers according to the invention particularly preferably comprise 0.1 to 25 mol % and in particular 1 to 15 mol % of one or more units of the formula (I) and/or (II).

The terms "alkyl", "aryl", "heteroaryl", etc., also encompass polyvalent groups, for example alkylene, arylene and heteroarylene.

The term "carbon radical" above and below denotes a mono- or polyvalent organic radical containing at least one carbon atom, where this either contains no further atoms (for example —C≡C—), or optionally contains one or more further atoms, such as, for example, N, O, S, P, Si, Se, As, Te or Ge (for example carbonyl). The term "hydrocarbon radical" denotes a carbon radical which additionally contains one or more H atoms and optionally one or more heteroatoms, such as, for example, N, O, S, P, Si, Se, As, Te or Ge.

A carbon or hydrocarbon radical can be a saturated or unsaturated group. Unsaturated groups are, for example, aryl, alkenyl or alkynyl groups. A carbon or hydrocarbon radical having more than 3 C atoms can be straight-chain, branched and/or cyclic and may also have spiro links or condensed rings.

Preferred carbon and hydrocarbon radicals are optionally substituted alkyl, alkenyl, alkynyl, alkoxy, alkylcarbonyl, alkoxycarbonyl, alkylcarbonyloxy and alkoxycarbonyloxy having 1 to 40, preferably 1 to 25, particularly preferably 1 to 18, C atoms, optionally substituted aryl or aryloxy having 6 to 40, preferably 6 to 25, C atoms, or optionally substituted alkylaryl, arylalkyl, alkylaryloxy, arylalkyloxy, arylcarbonyl, aryloxycarbonyl, arylcarbonyl-oxy and aryloxycarbonyloxy having 6 to 40, preferably 6 to 25, C atoms.

Further preferred carbon and hydrocarbon radicals are $C_1$-$C_{40}$ alkyl, $C_2$-$C_{40}$ alkenyl, $C_2$-$C_{40}$ alkynyl, $C_3$-$C_{40}$ allyl, $C_4$-$C_{40}$ alkyldienyl, $C_4$-$C_{40}$ polyenyl, $C_6$-$C_{40}$ aryl, $C_6$-$C_{40}$ alkylaryl, $C_6$-$C_{40}$ arylalkyl, $C_6$-$C_{40}$ alkylaryloxy, $C_6$-$C_{40}$ arylalkyloxy, $C_3$-$C_{40}$ heteroaryl, $C_4$-$C_{40}$ cycloalkyl, $C_4$-$C_{40}$ cyclo-alkenyl, etc. Particular preference is given to $C_1$-$C_{22}$ alkyl, $C_2$-$C_{22}$ alkenyl, $C_2$-$C_{22}$ alkynyl, $C_3$-$C_{22}$ alkyl, $C_4$-$C_{22}$ alkyldienyl, $C_6$-$C_{12}$ aryl, $C_6$-$C_{20}$ arylalkyl and $C_4$-$C_{20}$ heteroaryl.

Further preferred carbon and hydrocarbon radicals are straight-chain, branched or cyclic alkyl radicals having 1 to 40, preferably 1 to 22, C atoms, which are unsubstituted or mono- or polysubstituted by F, Cl, Br, I or CN, and in which one or more non-adjacent $CH_2$ groups may each be replaced, independently of one another, by —C(R)=C(R)—, —N(R)—, —O—, —S—, —CO—, —CO—O—, —O—CO— and/or —O—CO—O— in such a way that O and/or S atoms are not linked directly to one another, where R has the meaning indicated above.

Preferred alkyl groups are, for example, methyl, ethyl, n-propyl, isopropyl, n-butyl, isobutyl, s-butyl, t-butyl, 2-methylbutyl, n-pentyl, s-pentyl, cyclo-pentyl, n-hexyl, cyclohexyl, 2-ethylhexyl, n-heptyl, cycloheptyl, n-octyl, cyclooctyl, dodecanyl, trifluoromethyl, perfluoro-n-butyl, 2,2,2-trifluoroethyl, perfluorooctyl and perfluorohexyl.

Preferred alkenyl groups are, for example, ethenyl, propenyl, butenyl, pentenyl, cyclopentenyl, hexenyl, cyclohexenyl, heptenyl, cycloheptenyl, octenyl and cyclooctenyl.

Preferred alkynyl groups are, for example, ethynyl, propynyl, butynyl, pentynyl, hexynyl and octynyl.

Preferred alkoxy groups are, for example, methoxy, ethoxy, 2-methoxy-ethoxy, n-propoxy, i-propoxy, n-butoxy, i-butoxy, s-butoxy, t-butoxy, 2-methylbutoxy, n-pentoxy, n-hexoxy, n-heptoxy and n-octoxy.

Preferred amino groups are, for example, dimethylamine, methylamine, methylphenylamine and phenylamine.

The term "aryl" denotes an aromatic carbon group or a group derived therefrom. The term "heteroaryl" denotes "aryl" in accordance with the above definition, containing one or more heteroatoms.

An aromatic or heteroaromatic ring system in the sense of the present invention is intended to be taken to mean a system which does not necessarily contain only aromatic or heteroaromatic groups, but instead in which, in addition, a plurality of aromatic or heteroaromatic groups may be interrupted by a short non-aromatic unit (<10% of the atoms other than H, preferably <5% of the atoms other than H), such as, for example, C ($sp^3$-hybridised), O and/or N. Thus, for example, systems such as 9,9'-spirobifluorene, 9,9-diarylfluorene and triarylamine are also intended to be taken to be aromatic ring systems.

Aryl groups can be monocyclic or polycyclic, i.e. they can have one ring (for example phenyl) or two or more rings, which may also be condensed (for example naphthyl) or covalently bonded (for example biphenyl), or a combination of condensed and linked rings. Preference is given to fully conjugated aryl groups.

Preferred aryl groups are, for example, phenyl, biphenyl, triphenyl, [1,1':3',1"]terphenyl-2'-yl, naphthyl, anthracene, binaphthyl, phenanthrene, dihydrophenanthrene, pyrene, dihydropyrene, chrysene, perylene, tetracene, pentacene, benzopyrene, fluorene, indene, indenofluorene and spirobifluorene.

Preferred heteroaryl groups are, for example, 5-membered rings, such as, for example, pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings, such as, for example, pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or condensed groups, such as, for example, indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, isobenzothiophene, dibenzo-thiophene, benzo-thiadiazothiophene, or combinations of these groups. The heteroaryl groups may also be substituted by alkyl, alkoxy, thioalkyl, fluorine, fluoro-alkyl or further aryl or heteroaryl groups.

The aryl, heteroaryl, carbon and hydrocarbon radicals optionally have one or more substituents, which are preferably selected from the group consisting of silyl, sulfo, sulfonyl, formyl, amine, imine, nitrile, mercapto, nitro, halogen, $C_{1-12}$ alkyl, $C_{6-12}$ aryl, $C_{1-12}$ alkoxy, hydroxyl or combinations of these groups.

Preferred substituents are, for example, solubility-promoting groups, such as alkyl or alkoxy, electron-withdrawing groups, such as fluorine, nitro or nitrile, or substituents for increasing the glass transition temperature (Tg) in the polymer, in particular bulky groups, such as, for example, t-butyl or optionally substituted aryl groups.

Particularly preferred substituents are, for example, F, Cl, Br, I, —CN, —NO$_2$, —NCO, —NCS, —OCN, —SCN, —C(=O)N(R)$_2$, —C(=O)Y$^1$, —C(=O)R and —N(R)$_2$, in which R has the meaning indicated above and Y$^1$ denotes halogen, optionally substituted silyl, aryl having 4 to 40, preferably 6 to 20, C atoms, and straight-chain or branched alkyl, alkoxy, alkylcarbonyl, alkoxycarbonyl, alkylcarbonyloxy or alkoxycarbonyloxy having 1 to 22 C atoms, in which one or more H atoms may optionally be replaced by F or Cl.

"Halogen" denotes F, Cl, Br or I.

Aryl(oxy) and heteroaryl(oxy) radicals are preferably mono- or polysubstituted, as defined above.

Very particular preference is given to polymers comprising structural units of the formula (I) selected from the following sub-formulae:

(Ia)

(Ib)

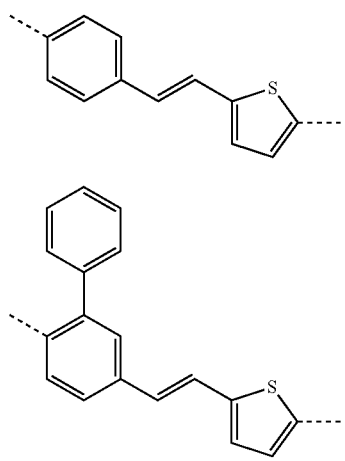

-continued (Ic)

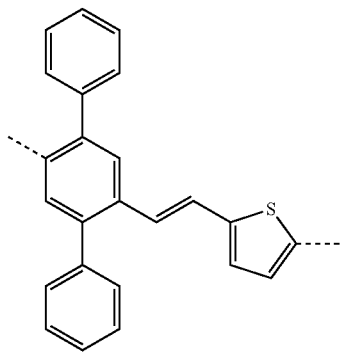

(Id)

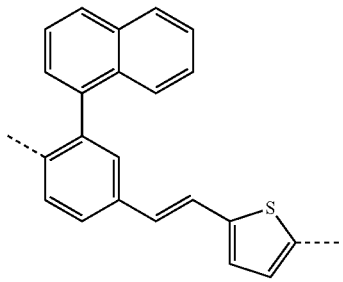

(Ie)

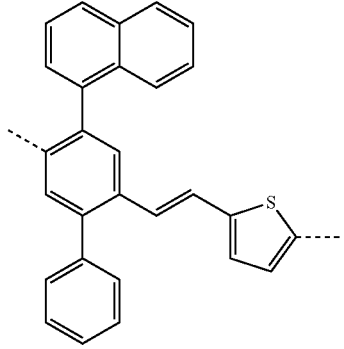

(If)

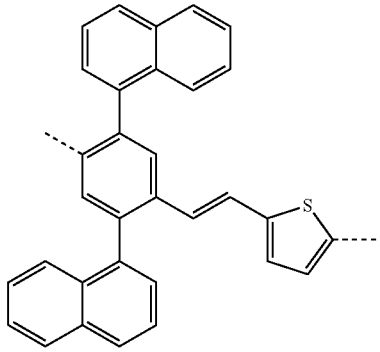

where the dashed lines on the thiophene and phenyl rings represent the linking in the polymer (and not methyl groups). Possible and/or preferred further substituents R are not shown for reasons of clarity.

For polymers comprising structural units of the formula (II), the same sub-formulae as depicted above for the structural units of the formula (I) are very particularly preferred.

Besides one or more structural units of the formula (I) and/or (II), the polymers according to the invention may also comprise further structural units. These are, inter alia, those as disclosed and listed extensively, for example, in WO 02/077060 A1 and in WO 2005/014689 A2. These are incorporated into the present invention by way of reference. The further structural units can originate, for example, from the following classes:

Group 1: Units which influence the hole-injection and/or hole-transport properties of the polymers;
Group 2: Units which influence the electron-injection and/or electron-transport properties of the polymers;
Group 3: Units which have combinations of individual units from group 1 and group 2;
Group 4: Units which modify the emission characteristics to such an extent that electrophosphorescence can be obtained instead of electrofluorescence;
Group 5: Units which improve the transfer from the so-called singlet state to the triplet state;
Group 6: Units which influence the emission colour of the resultant polymers;
Group 7: Units which are typically used as backbone;
Group 8: Units which influence the film-morphological properties and/or the rheological properties of the resultant polymers.

Preferred polymers according to the invention are those in which at least one structural unit has charge-transport properties, i.e. which comprise units from groups 1 and/or 2.

Structural units from group 1 which have hole-injection and/or hole-transport properties are, for example, triarylamine, benzidine, tetraaryl-para-phenylenediamine, triarylphosphine, phenothiazine, phenoxazine, dihydro-phenazine, thianthrene, dibenzo-para-dioxin, phenoxathiyne, carbazole, azulene, thiophene, pyrrole and furan derivatives and further O-, S- or N-containing heterocycles having a high HOMO (HOMO=highest occupied molecular orbital). These arylamines and heterocycles preferably result in an HOMO in the polymer of greater than −5.8 eV (against vacuum level), particularly preferably greater than −5.5 eV.

Structural units from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles having a low LUMO (LUMO=lowest un-occupied molecular orbital). These units in the polymer preferably result in an LUMO of less than −2.5 eV (against vacuum level), particularly preferably less than −2.7 eV.

It may be preferred for the polymers according to the invention to comprise units from group 3 containing structures which increase the hole mobility and structures which increase the electron mobility (i.e. units from groups 1 and 2) are bonded directly to one another or structures which increase both the hole mobility and the electron mobility. Some of these units can serve as emitters and shift the emission colour into the green, yellow or red. Their use is thus suitable, for example, for the generation of other emission colours from originally blue-emitting polymers.

Structural units from group 4 are those which are able to emit light from the triplet state with high efficiency, even at room temperature, i.e. exhibit electrophosphorescence instead of electrofluorescence, which frequently causes an increase in the energy efficiency. Suitable for this purpose are firstly compounds which contain heavy atoms having an atomic number of greater than 36. Preference is given to compounds which contain d- or f-transition metals which satisfy the above-mentioned condition. Particular preference is given here to corresponding structural units which contain elements from groups 8 to 10 (Ru, Os, Rh, Ir, Pd, Pt). Suitable structural units for the polymers according to the invention here are, for example, various complexes, as disclosed, for example, in WO 02/068435 A1, WO 02/081488 A1, EP 1239526 A2 and WO 2004/026886 A2. Corresponding monomers are disclosed in WO 02/068435 A1 and in WO 2005/042548 A1.

Structural units from group 5 are those which improve the transfer from the singlet state to the triplet state and which, employed in support of the structural elements from group 4, improve the phosphorescence properties of these structural elements. Suitable for this purpose are, in particular, carbazole and bridged carbazole dimer units, as disclosed, for example, in WO 2004/070772 A2 and WO 2004/113468 A1. Also suitable for this purpose are ketones, phosphine oxides, sulfoxides, sulfones, silane derivatives and similar compounds, as disclosed, for example, in WO 2005/040302 A1.

Structural units from group 6, besides those mentioned above, are those which have at least one further aromatic structure or another conjugated structure which does not fall under the above-mentioned groups, i.e. which have only little influence on the charge-carrier mobilities, are not organometallic complexes or do not influence the singlet-triplet transfer. Structural elements of this type can influence the emission colour of the resultant polymers. Depending on the unit, they can therefore also be employed as emitters. Preference is given here to aromatic structures having 6 to 40 C atoms and also tolan, stilbene or bisstyrylarylene derivatives, each of which may be substituted by one or more radicals R. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4''-terphenylylene, 4,4'-bi-1,1'-naphthylylene, 4,4'-tolanylene, 4,4'-stilbenzylene, 4,4''-bisstyrylarylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives, which are preferably substituted, or preferably conjugated push-pull systems (systems which are substituted by donor and acceptor substituents) or systems such as squarines or quinacridones, which are preferably substituted.

Structural units from group 7 are units which contain aromatic structures having 6 to 40 C atoms, which are typically used as polymer backbone. These are, for example, 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives.

Structural units from group 8 are those which influence the film-morphological properties and/or the rheological properties of the polymers, such as, for example, siloxanes, long alkyl chains or fluorinated groups, but also particularly rigid or flexible units, such as, for example, liquid crystal-forming units or crosslinkable groups.

Preference is given to polymers according to the invention which simultaneously additionally comprise one or more units selected from groups 1 to 8 besides structural units of the formula (I) and/or (II). It may likewise be preferred for more than one structural unit from one group to be present simultaneously.

However, a smaller proportion of the emitting units, in particular green- and red-emitting units, may also be preferred, for example for the synthesis of white-emitting copolymers. The way in which white-emitting copolymers can be synthesised is disclosed in detail, for example, in WO 2005/030827 A1 and WO 2005/030828 A1.

Preference is given here to polymers according to the invention which, besides at least one structural unit of the formula (I) and/or (II), also comprise units from group 7, particularly preferably at least 50 mol % of these units.

It is likewise preferred for the polymers according to the invention to comprise units which improve the charge transport or charge injection, i.e. units from groups 1 and/or 2; a proportion of 0.5 to 30 mol % of these units is particularly preferred; a proportion of 1 to 10 mol % of these units is very particularly preferred.

It is furthermore particularly preferred for the polymers according to the invention to comprise structural units from group 7 and units from groups 1 and/or 2, in particular at least 50 mol % of units from group 7 and 0.5 to 30 mol % of units from groups 1 and/or 2.

The requisite solubility of the polymers is ensured, in particular, by the substituents on the various recurring units, both the substituents $R^{1-10}$ on the structural units of the formula (I) and/or (II) and also by substituents on the other recurring units.

The polymers according to the invention are either homopolymers comprising structural units of the formula (I) and/or (II) or copolymers. The polymers according to the invention can be linear, branched or cross-linked. Besides one or more structural units of the formula (I) and/or (II), or preferred sub-formulae thereof, copolymers according to the invention may potentially have one or more further structures from groups 1 to 8 mentioned above.

The copolymers according to the invention may have random, alternating or block-like structures or have a plurality of these structures in an alternating arrangement. The way in which copolymers having block-like structures can be obtained and which further structural elements are particularly preferred for this purpose is described in detail, for example, in WO 2005/014688 A2. The latter is incorporated into the present application by way of reference. It should likewise again be emphasised at this point that the polymer may also have dendritic structures.

The polymers according to the invention comprising structural units of the formula (I) and/or (II) are accessible readily and in high yields. They preferably exhibit blue luminescence in the solid state.

The polymers according to the invention have advantageous properties, in particular long lifetimes, high efficiencies and good colour coordinates.

The polymers according to the invention are generally prepared by polymerisation of one or more types of monomer, of which at least one monomer results in structural units of the formula (I) and/or (II) in the polymer. Suitable polymerisation reactions are known to the person skilled in the art and are described in the literature. Particularly suitable and preferred polymerisation reactions which result in C—C or C—N links are the following:

(A) SUZUKI polymerisation;
(B) YAMAMOTO polymerisation;
(C) STILLE polymerisation;
(D) HECK polymerisation;
(E) NEGISHI polymerisation;
(F) SONOGASHIRA polymerisation;
(G) HIYAMA polymerisation; and
(H) HARTWIG-BUCHWALD polymerisation.

The way in which the polymerisation can be carried out by these methods and the way in which the polymers can then be separated off from the reaction medium and purified is known to the person skilled in the art and is described in detail in the literature, for example in WO 03/048225 A2, WO 2004/037887 A2 and WO 2004/037887 A2.

The C—C linking reactions are preferably selected from the groups of the SUZUKI coupling, the YAMAMOTO coupling and the STILLE coupling, and the C—N linking reaction is preferably a HARTWIG-BUCHWALD coupling.

The present invention thus also relates to a process for the preparation of the polymers according to the invention, which is characterised in that they are prepared by SUZUKI polymerisation, YAMAMOTO polymerisation, STILLE polymerisation or HARTWIG-BUCHWALD polymerisation.

The dendrimers according to the invention can be prepared by processes known to the person skilled in the art or analogously thereto. Suitable processes are described in the literature, such as, for example, in Frechet, Jean M. J.; Hawker, Craig J., "Hyperbranched polyphenylene and hyperbranched polyesters; new soluble, three-dimensional, reactive polymers", Reactive & Functional Polymers (1995), 26(1-3), 127-36; Janssen, H. M.; Meijer, E. W., "The synthesis and characterization of dendritic molecules", Materials Science and Technology (1999), 20 (Synthesis of Polymers), 403-458; Tomalia, Donald A., "Dendrimer molecules", Scientific American (1995), 272(5), 62-6, WO 02/067343 A1 and WO 2005/026144 A1.

For the synthesis of the polymers according to the invention, the corresponding monomers are required. Monomers which result in structural units of the formula (I) or (II) in the polymers according to the invention are 2-vinylthiophenyl-benzene derivatives, which are optionally correspondingly substituted and have suitable functionalities in one, two, three or four, preferably 2, positions, which allow this monomer unit to be incorporated into the polymer. These monomers are novel and are therefore likewise a subject-matter of the present invention.

The present invention thus furthermore relates to compounds of the formulae (III) and (IV):

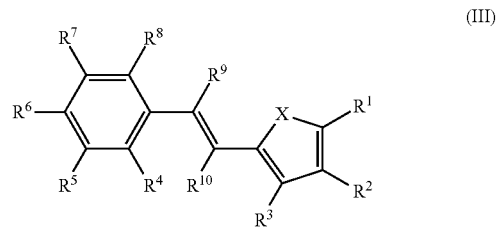

(III)

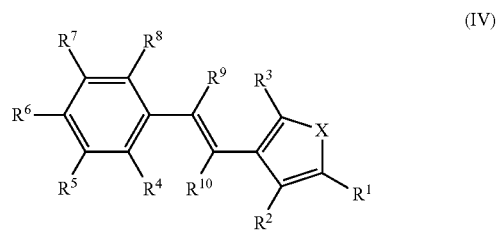

(IV)

which are characterised in that two of the radicals $R^1$ to $R^{10}$ are, identically or differently, functional groups which polymerise under the conditions of the C—C or C—N linking reactions, where the other symbols and indices have the same meanings as in relation to the structural units of the formulae (I) and (II).

The functional groups are preferably selected from Cl, Br, I, O-tosylate, O-triflate, O—$SO_2R^2$, $B(OR^2)_2$ and $Sn(R^2)_3$, particularly preferably from Br, I and $B(OR^2)_2$, where $R^2$ is on each occurrence, identically or differently, H, an aliphatic or aromatic hydrocarbon radical having 1 to 20 C atoms, and where two or more radicals $R^2$ may also form a ring system with one another.

The same preference applies to the bifunctional monomeric compounds of the formulae (III) and (IV) as described for the structural units of the formulae (I) and (II) above.

The synthesis of the units from groups 1 to 8 described above and the further emitting units is known to the person skilled in the art and is described in the literature, for example in WO 2005/014689 A2, WO 2005/030827 A1 and WO 2005/030828 A1. These documents and the literature cited therein are incorporated into the present application by way of reference.

It may additionally be preferred to use the polymers according to the invention not as the pure substance, but instead as a blend (mixture) together with further polymeric, oligomeric, dendritic or low-molecular-weight substances of any desired type. These may, for example, improve the electronic properties or themselves emit. Above and below, a blend denotes a mixture comprising at least one polymeric component.

The present invention thus furthermore relates to a polymer blend comprising one or more polymers according to the invention and one or more further polymeric, oligomeric, dendritic or low-molecular-weight substances.

The invention furthermore relates to solutions and formulations comprising one or more polymers or blends according to the invention in one or more solvents. The way in which solutions of this type can be prepared is known to the person skilled in the art and is described, for example, in WO 02/072714 A1, WO 03/019694 A2 and the literature cited therein.

These solutions can be used to produce thin polymer layers, for example by area-coating processes (for example spin coating) or by printing processes (for example ink-jet printing).

Polymers comprising structural units of the formula (I) and/or (II) which contain one or more polymerisable and thus crosslinkable groups are particularly suitable for the production of films or coatings, in particular for the production of structured coatings, for example by thermal or light-induced in-situ polymerisation and in-situ crosslinking, such as, for example, in-situ UV photopolymerisation or photopatterning. For applications of this type, particular preference is given to polymers according to the invention containing one or more crosslinkable groups selected from acrylate, methacrylate, vinyl, epoxy and oxetane. It is possible here not only to use corresponding polymers as the pure substance, but also to use formulations or blends of these polymers as described above. These can be used with or without addition of solvents and/or binders. Suitable materials, processes and devices for the methods described above are disclosed, for example, in WO 2005/083812 A2. Possible binders are, for example, polystyrene, polycarbonate, polyacrylates, polyvinylbutyral and similar, opto-electronically neutral polymers.

Suitable and preferred solvents are, for example, toluene, anisole, xylene, methyl benzoate, dimethylanisole, mesitylene, tetralin, veratrol and tetra-hydrofuran.

The polymers, blends and formulations according to the invention can be used in electronic or opto-electronic devices or for the production thereof.

The present invention thus furthermore relates to the use of the polymers, blends and formulations according to the invention in electronic or opto-electronic devices, preferably in organic or polymeric light-emitting diodes (OLEDs, PLEDs), organic field-effect transistors (OFETs), organic integrated circuits (O-ICs), organic thin-film transistors (TFTs), organic solar cells (O-SCs), organic laser diodes (O-lasers), organic photovoltaic (OPV) elements or devices or organic photoreceptors (OPCs), particularly preferably in organic or polymeric light-emitting diodes (OLEDs, PLEDs), in particular in polymeric light-emitting diodes (PLEDs).

The way in which OLEDs or PLEDs can be produced is known to the person skilled in the art and is disclosed in detail, for example, as a general process in WO 2004/070772 A2, which should be adapted correspondingly for the individual case.

As described above, the polymers according to the invention are very particularly suitable as electroluminescent materials in PLEDs or displays produced in this way.

Electroluminescent materials in nthe sense of the present invention are taken to mean materials which can be used as active layer. Active layer means that the layer is capable of emitting light on application of an electric field (light-emitting layer) and/or that it improves the injection and/or transport of positive and/or negative charges (charge-injection or charge-transport layer).

The present invention therefore also preferably relates to the use of the polymers or blends according to the invention in a PLED, in particular as electroluminescent material.

The present invention furthermore relates to electronic or opto-electronic components, preferably organic or polymeric light-emitting diodes (OLEDs, PLEDs), organic field-effect transistors (OFETs), organic integrated circuits (O-ICs), organic thin-film transistors (TFTs), organic solar cells (O-SCs), organic laser diodes (O-lasers), organic photovoltaic (OPV) elements or devices or organic photoreceptors (OPCs), particularly preferably organic or polymeric light-emitting diodes, in particular polymeric light-emitting diodes, having one or more active layers, where at least one of these active layers comprises one or more polymers according to the invention. The active layer can be, for example, a light-emitting layer, a charge-transport layer and/or a charge-injection layer.

The present application text and also the examples below are principally directed to the use of the polymers according to the invention in relation to PLEDs and corresponding displays. In spite of this restriction of the description, it is possible for the person skilled in the art, without further inventive step, also to use the polymers according to the invention as semiconductors for the further uses described above in other electronic devices.

The following examples are intended to explain the invention without restricting it. In particular, the features, properties and advantages described therein of the defined compounds on which the relevant example is based can also be applied to other compounds which are not described in detail, but fall within the scope of protection of the claims, unless stated otherwise elsewhere.

EXAMPLES 1 AND 2

Monomer Examples

Example 1

Preparation of 4-(5-bromo-2-vinylthiophenyl)-1-bromobenzene 3

The compound is prepared as follows:

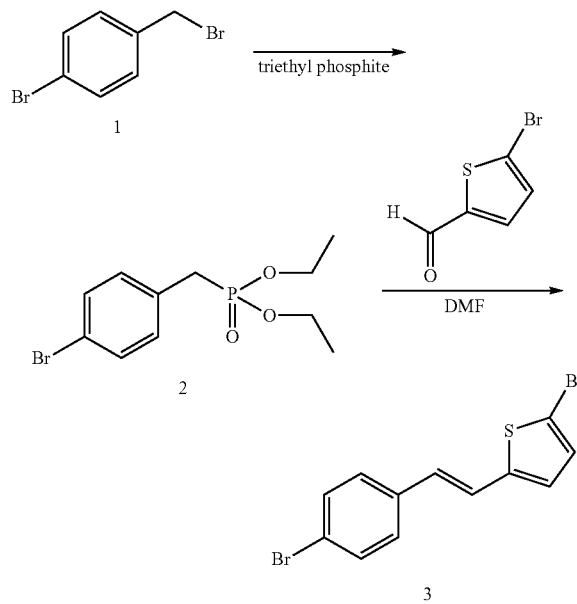

1.1 Diethyl (4-bromobenzyl)phosphonate 2

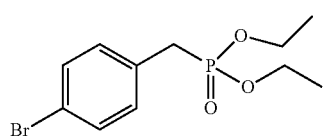

40.69 g (1 molar equivalent, 163 mmol) of 4-bromobenzyl bromide 1 are heated at 160° C. in 28.3 ml (1 molar equivalent, 163 mmol) of triethyl phosphite until the evolution of gas is complete. The batch is distilled in vacuo, and the residue remaining in the form of an oil 2 (48.87 g, 98%) is employed in the subsequent reaction without further purification.

$^1$H NMR (CDCl$_3$, δ (ppm), J (Hz)): 1.25 (t, 6H, J=7.1), 3.07 (s, 1H), 3.11 (s, 1H), 4.01 (m, 4H), 7.17 (d, 2H, J=8.4), 7.43 (d, 2H, J=8.4).

1.2 4-(5-Bromo-2-vinylthiophenyl)-1)-1-bromobenzene 3

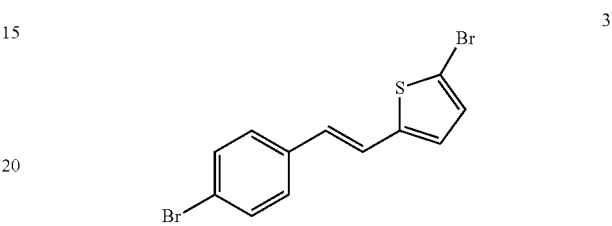

30 g (1 molar equivalent, 98 mmol) of diethyl (4-bromobenzyl)phosphonate 2 are initially introduced in 500 ml of dimethylformamide (DMF), 18.78 g of sodium tert-butoxide (2 molar equivalents, 196 mmol) are added at about 0° C. under a protective gas, and, after a stirring time of 30 minutes at 0° C., a solution of 21.61 g (1.1 molar equivalents, 107 mmol) of 5-bromo-2-thiophenecarbaldehyde in 150 ml of DMF is slowly added dropwise at 0° C. After 1 hour, 200 ml of ethanol and 150 ml of water are added dropwise at 5° C., the mixture is stirred overnight at room temperature, and the precipitate is filtered off with suction, washed with methanol and dried. Recrystallisation from methanol gives the product 3 (18.23 g, 54%).

$^1$H NMR (CDCl$_3$, δ (ppm), J (Hz)): 6.74 (d, 1H, J=16), 6.81 (d, 1H, J=3.9), 6.96 (d, 1H, J=3.9), 7.09 (d, 1H, J=16), 7.31 (d, 2H, J=8.5), 7.45 (d, 2H, J=8.5).

Example 2

Preparation 4-(5-bromo-2-vinylthiophenyl)-3-(2,5-dimethylphen-1-yl)-1-bromobenzene 10

The compound is prepared as follows:

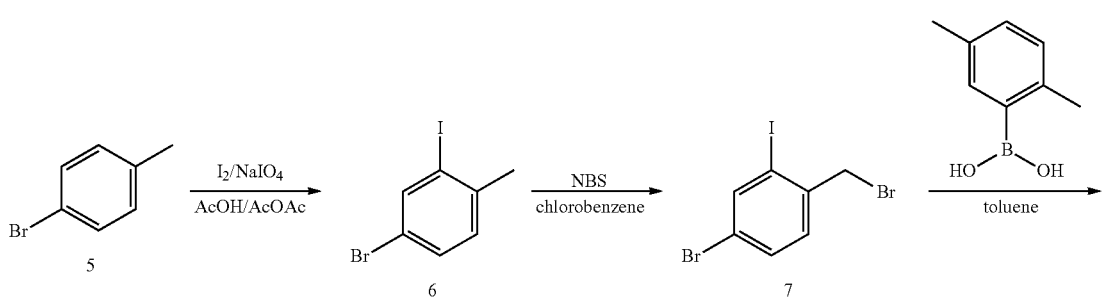

-continued

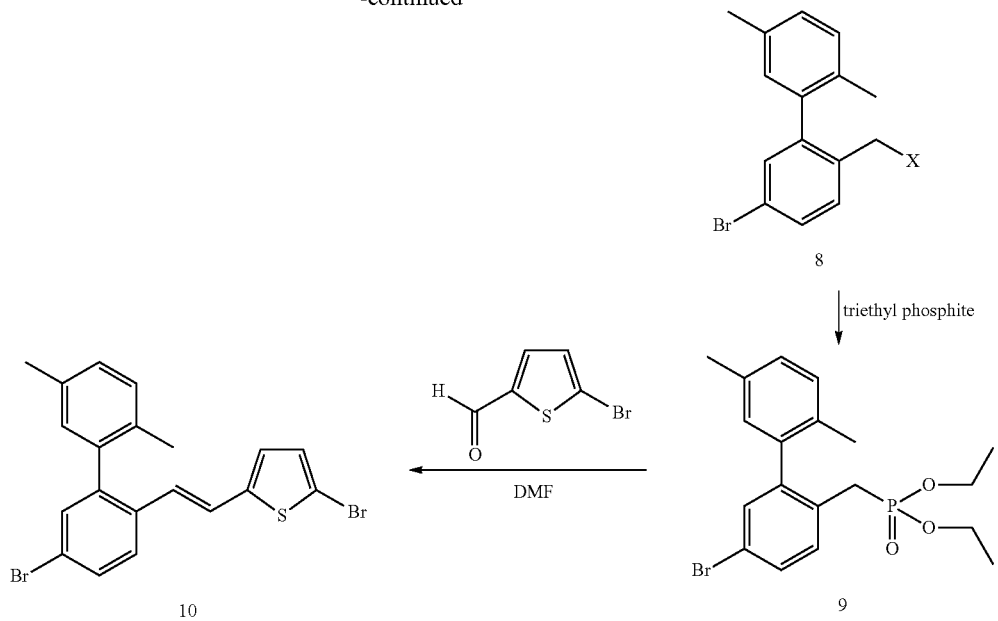

2.1 2-Iodo-4-bromotoluene 6

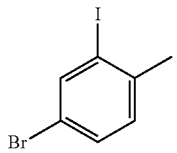

Sodium periodate (0.5 molar equivalent, 102.5 g, 0.48 mol) and iodine (0.3 molar equivalent, 81.6 g, 0.32 mol) are suspended in acetic acid (700 ml) and acetic anhydride (340 ml). The batch is then cooled to 10° C., and sulfuric acid (2.9 molar equivalents, 142 ml, 2.66 mol) is slowly added dropwise at this temperature. 4-Bromotoluene 5 (1 molar equivalent, 160.7 g, 0.94 mol) is subsequently slowly added dropwise at room temperature, and the batch is stirred overnight. After addition of cooled water (1000 ml) and a solution of Na$_2$SO$_3$ (169 g in 1000 ml), the mixture is extracted by shaking with dichloromethane (DCM). The organic phase is washed with water, dried and evaporated in a rotary evaporator. The product 6 (188.0 g, 67%) is obtained in the form of a liquid by vacuum distillation.

$^1$H NMR (CDCl$_3$, δ (ppm), J (Hz)): 2.39 (s, 3H), 7.10 (d, 1H, J=8.2), 7.37 (dd, 1H, J$_1$=2.0, J$_2$=8.2), 7.95 (d, 1H, J=2.0).

2.2 2-Iodo-4-bromo(bromomethyl)benzene 7

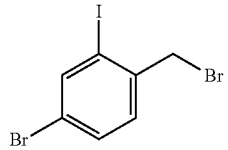

N-Bromosuccinimide (NBS) (1.1 molar equivalents, 66.5 g, 373 mmol) and benzyl peroxide (0.006 molar equivalent, 450.7 mg, 1.9 mmol) are added to a solution of 2-iodo-4-bromotoluene 6 (1 molar equivalent, 100.3 g, 338 mmol) in chlorobenzene (1200 ml). The batch is then stirred under reflux overnight. After the solvent has been removed in a rotary evaporator, ethyl acetate and water are added. The aqueous phase is extracted by shaking with ethyl acetate. The organic phase is washed by shaking with water, dried and evaporated in a rotary evaporator. The product 7 (30.7 g, 24%) is obtained in the form of a white powder by recrystallisation from ethanol (50 ml).

$^1$H NMR (CDCl$_3$, δ (ppm), J (Hz)): 4.54 (s, 2H), 7.34 (d, 1H, J=8.1), 7.47 (dd, 1H, J$_1$=1.9, J$_2$=8.1), 8.01 (d, 1H, J=1.9).

2.3 4-Bromo-2-(2,5-dimethylphen-1-yl)bromomethylbenzene 8

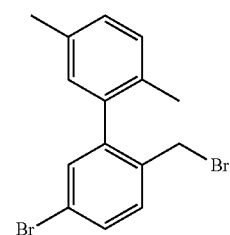

A solution of 2-iodo-4-bromo(bromomethyl)benzene 7 (1 molar equivalent, 30.5 g, 81 mmol), 2,5-dimethylphenylboronic acid (1 molar equivalent, 12.2 g, 81 mmol) and potassium carbonate (5 molar equivalents, 56 g, 405 mmol) in toluene (420 ml) and water (360 ml) is stirred under a protective gas for 30 minutes. Pd(PPh$_3$)$_4$ (0.005 molar equivalent, 458 mg, 0.4 mmol) is added, and the batch is stirred under reflux for 17 hours. The mixture is extracted by shaking with toluene. The organic phase is dried and evaporated in a rotary evaporator. The product 8 (9.28 g, 32%) is obtained in the form of a slightly yellowish oil by purification on a silica-gel column (eluent: heptane).

$^1$H NMR (CDCl$_3$, δ (ppm), J (Hz)): 2.06 (s, 3H), 2.35 (s, 3H), 4.08 (d, 1H, J=9.4), 4.31 (d, 1H, J=9.4), 6.99 (s, 1H), 7.13 (d, 1H, J=7.7), 7.18 (d, 1H, J=7.7), 7.25 (d, 1H, J=2.0), 7.40 (d, 1H, J=8.3), 7.44 (dd, 1H, J₁=2.0, J₂=8.3).

2.4 Diethyl[4-bromo-2-(2,5-dimethylphen-1-yl)benzyl]phosphonate 9

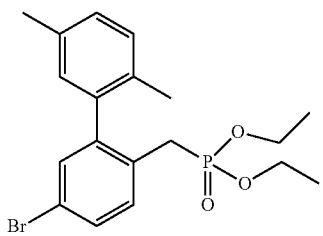

9

8.29 g (1 molar equivalent, 23 mmol) of 4-bromo-2-(2,5-dinnethylphen-1-yl)bromomethylbenzene 8 are heated at 180° C. in 4.4 ml (1.1 molar equivalents, 26 mmol) of triethyl phosphite until the evolution of gas is complete. The batch is distilled in vacuo, and the residue remaining in the form of a colourless oil 9 (8.6 g, 89%) is employed in the subsequent reaction without further purification.

¹H NMR (CDCl₃, δ (ppm), J (Hz)): 1.20-1.24 (m, 6H), 2.01 (s, 3H), 2.33 (s, 3H), 3.01-2.83 (m, 2H), 3.97-3.90 (m, 4H), 6.96 (s, 1H), 7.09 (d, 1H, J=7.9), 7.14 (d, 1H, J=7.7), 7.30 (s, 1H), 7.44 (dd, 1H, J₁=2.2, J₂=8.4), 7.48 (dd, 1H, J₁=2.5, J₂=8.4).

2.5 4-(5-Bromo-2-vinylthiophenyl)-3-(2,5-dimethylphen-1-yl)-1-bromo-benzene 10

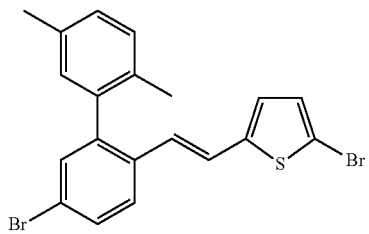

10

6.06 g (1 molar equivalent, 15 mmol) of diethyl[4-bromo-2-(2,5-dimethylphen-1-yl)benzyl]phosphonate 9 are initially introduced in 70 ml of DMF, 3.12 g of sodium tert-butoxide (2.2 molar equivalents, 33 mmol) are added at about 0° C. under a protective gas, and, after a stirring time of 40 minutes at 0° C., a solution of 2.99 g (1.1 molar equivalents, 16 mmol) of 5-bromo-2-thiophenecarbaldehyde in 40 ml of DMF is slowly added drop-wise at 0° C. After 2 hours, ethanol and water are added dropwise at 5° C., the mixture is stirred overnight at room temperature, and the batch is extracted by shaking with DCM. The organic phases are separated, washed with water, dried and evaporated in a rotary evaporator. Recrystallisation from acetonitrile gives the product 10 (1.29 g, 20%) in the form of a slightly yellowish powder.

¹H NMR (CDCl₃, δ (ppm), J (Hz)): 2.01 (s, 3H), 2.36 (s, 3H), 6.42 (d, 1H, J=16.0), 6.69 (d, 1H, J=3.7), 6.88 (d, 1H, J=3.8), 6.94 (s, 1H), 6.99 (d, 1H, J=16.0), 7.17-7.12 (m, 2H), 7.34 (d, 1H, J=2.0), 7.46 (dd, 1H, J₁=8.6, J₂=2.0) 7.53 (d, 1H, J=8.6).

Examples 3 to 6

Polymer Examples

Polymers P1 to P3 according to the invention and comparative polymer C1 are synthesised using the following monomers (percentage data=mol %) by SUZUKI coupling in accordance with WO 03/048225 A2.

Example 3

Polymer P1

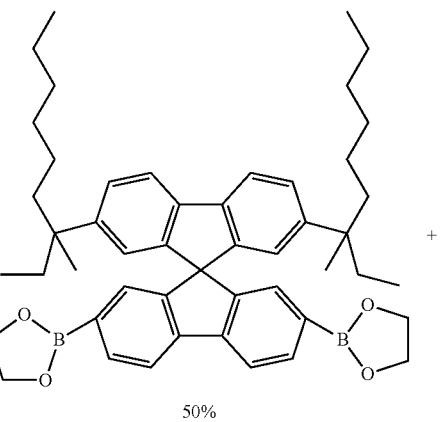

50%

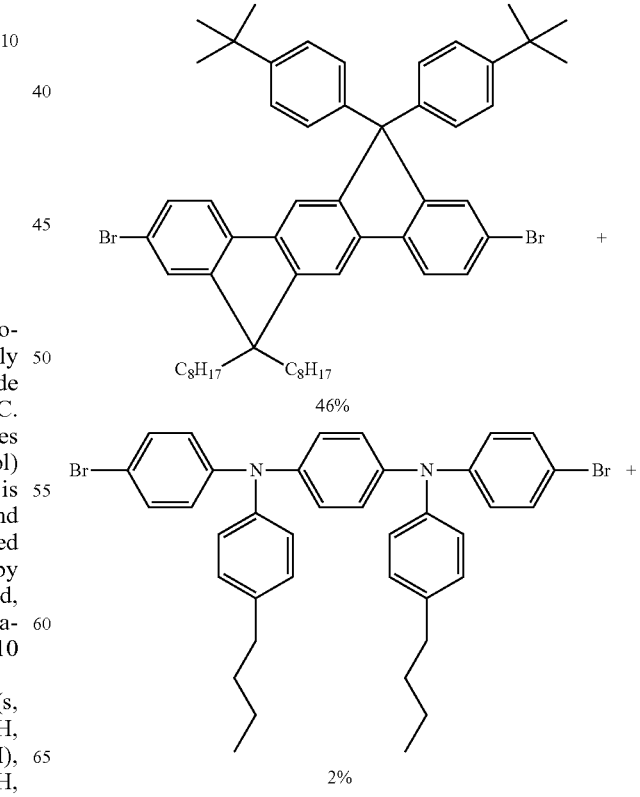

46%

2%

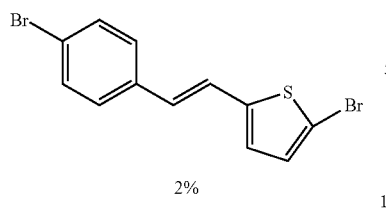
2%
Example 4
Polymer P2
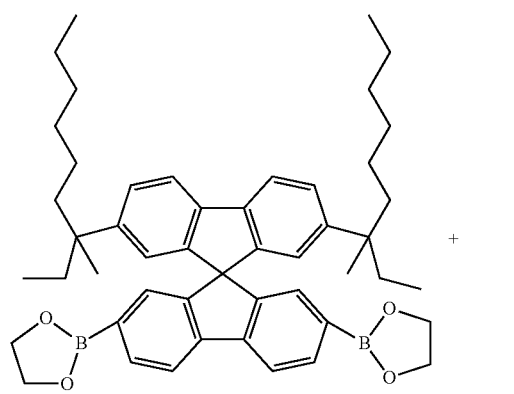
50%
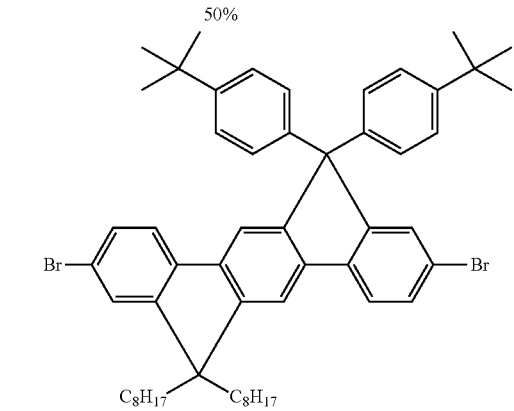
46%
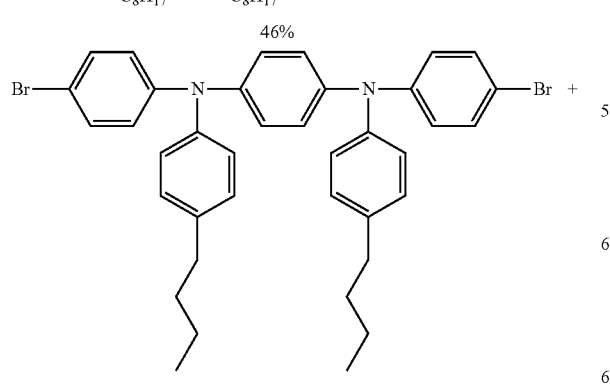
2%
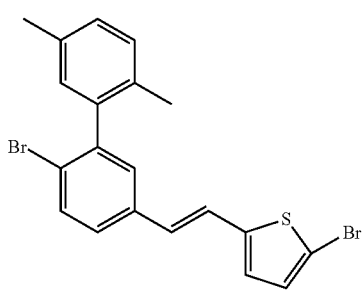
2%
Example 5
Polymer P3
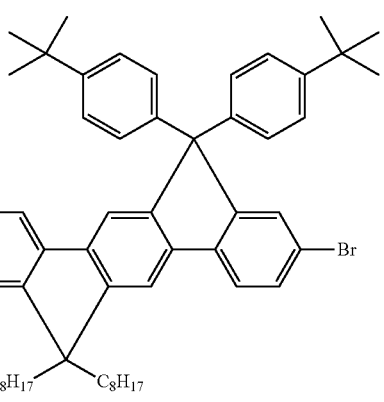
50%
43%

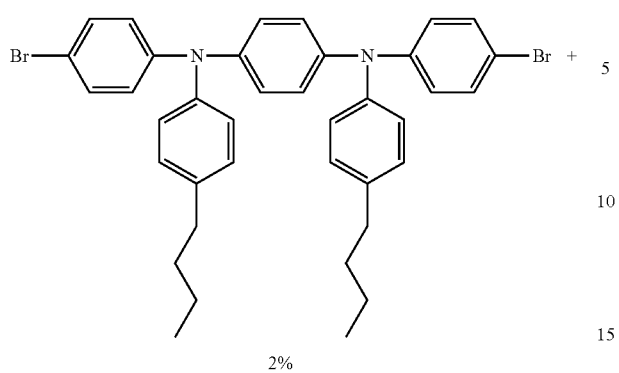

2%

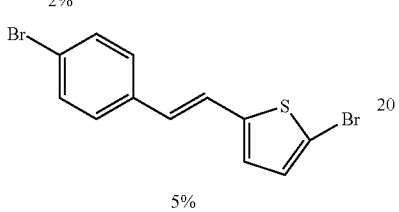

5%

Example 6

Comparative Polymer C1

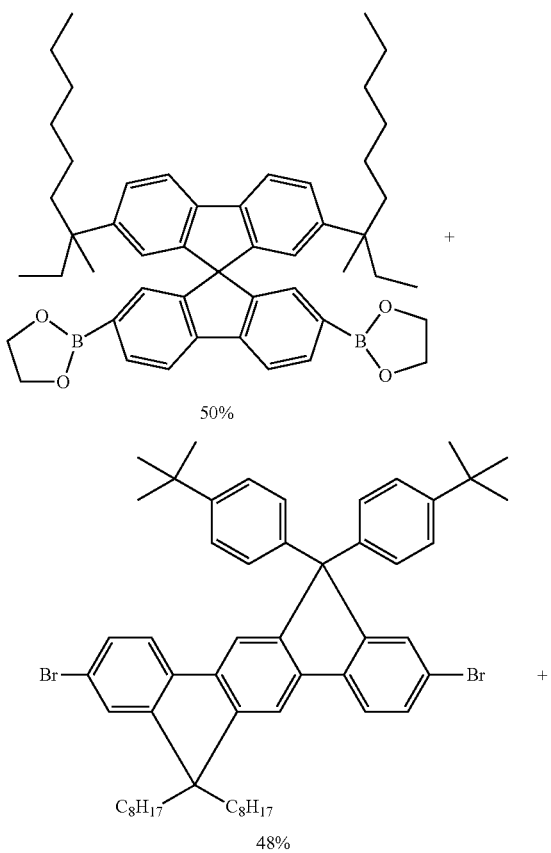

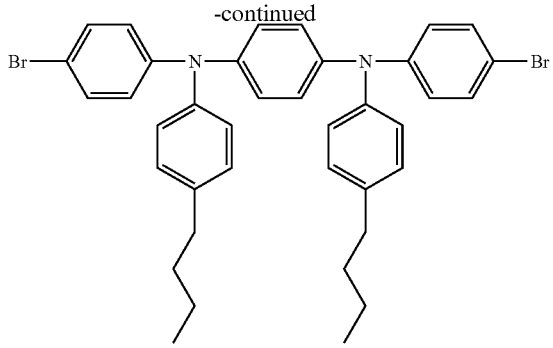

2%

Examples 7 to 10

Device Examples

Production of PLEDs

A polymeric organic light-emitting diode (PLED) is produced as already described many times in the literature (for example in WO 2004/037887 A2). In order to explain the present invention in illustrative terms, PLEDs are produced with polymers P1 to P3 and comparative polymer C1 by spin coating. A typical device has the structure depicted in FIG. 1.

Figure 2:
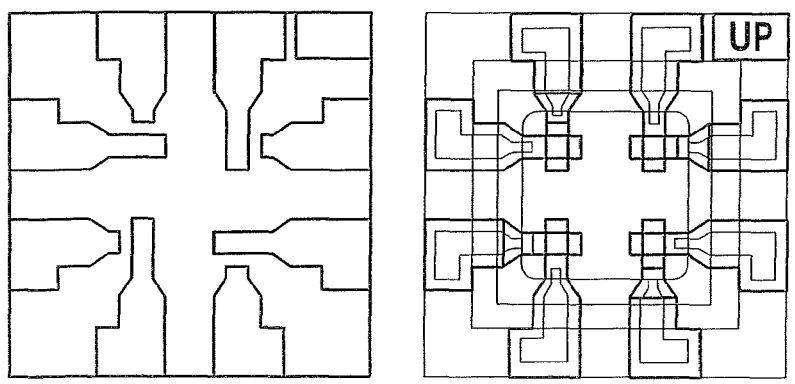
FIG. 2 illustrates a diagram on the left: ITO structure applied to the glass support, diagram on the right: complete electronic structure with ITO, vapour-deposited cathode and optional metallisation of the leads).

To this end, specially manufactured substrates from Technoprint are used in a layout designed specifically for this purpose (FIG. 2, diagram on the left: ITO structure applied to the glass support, diagram on the right: complete electronic structure with ITO, vapour-deposited cathode and optional metallisation of the leads). The ITO structure (indium tin oxide, a transparent, conductive anode) is applied to soda-lime glass by sputtering in a pattern such that 4 pixels measuring 2×2 mm are obtained with the cathode vapour-deposited at the end of the production process.

The substrates are cleaned with deionised water and a detergent (Deconex 15 PF) in a clean room and then activated by UV/ozone plasma treatment. An 80 nm layer of PEDOT (PEDOT is a polythiophene derivative (Baytron P VAI 4083sp.) from H. C. Starck, Goslar, which is supplied as an aqueous dispersion) is then applied by spin coating, likewise in a clean room. The spin rate required depends on the degree of dilution and the specific spin-coater geometry (typical for 80 nm: 4500 rpm). In order to remove residual water from the layer, the substrates are dried by heating on a hotplate at 180° C. for 10 minutes. Then, under an inert-gas atmosphere (nitrogen or argon), firstly 20 nm of an interlayer (typically a hole-dominated polymer, here HIL-012 from Merck) and then 65 nm of the polymer layers are applied from toluene solutions (concentration of inter-layer 5 g/l, for polymers P1 to P3 and C1 8 g/l in each case). Both layers are dried by heating at 180° C. for at least 10 minutes. The Ba/Al cathode is then vapour-deposited in the pattern indicated through a vapour-deposition mask (high-purity metals from Aldrich, particularly barium 99.99% (Order No. 474711); vapour-deposition units from Lesker or others, typical vacuum level $5 \times 10^{-6}$ mbar). Finally, the device is encapsulated in order to protect, in particular, the cathode against air and atmospheric moisture. The device is encapsulated by sticking a commercially available cover slip over the pixelated area. The device is subsequently characterised.

Figure 3:
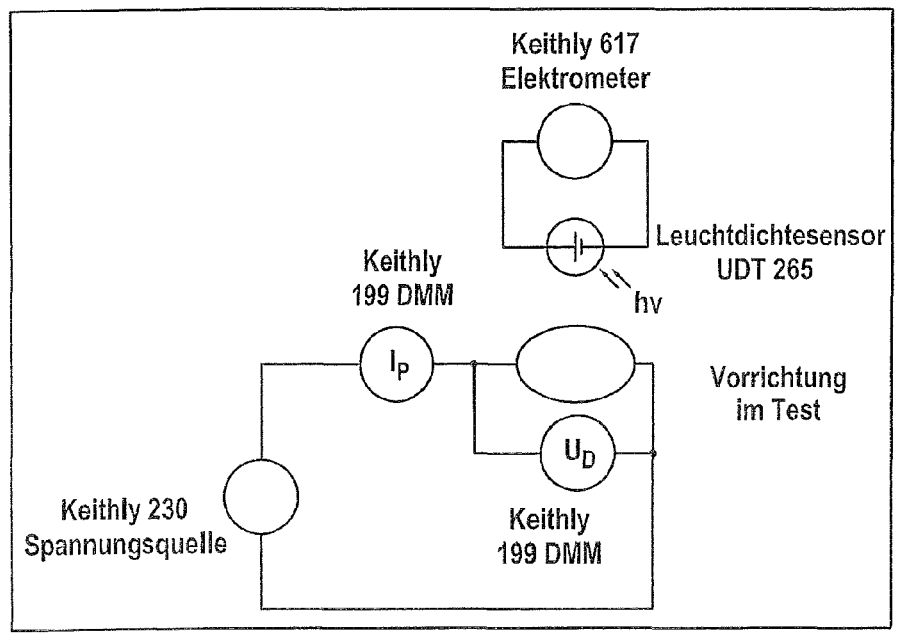
FIG. 3 illustrates the typical measurement set-up.

To this end, the devices are clamped into holders manufactured specifically for the substrate size and provided with spring contacts. A photodiode with eye response filter can be placed directly on the measurement holder in order to exclude influences from extraneous light. The typical measurement set-up is depicted in FIG. 3.

The voltages are typically increased from 0 to max. 20 V in 0.2 V steps and reduced again. For each measurement point, the current through the device and the photocurrent obtained are measured by the photodiode. In this way, the IUL data of the test devices are obtained. Important parameters are the maximum efficiency measured ("max. eff." in cd/A) and the voltage required for 100 cd/m².

In order, in addition, to know the colour and the precise electroluminescence spectrum of the test devices, the voltage required for 100 cd/m² is applied again after the first measurement, and the photodiode is replaced by a spectrum measurement head. This is connected to a spectrometer (Ocean Optics) by an optical fibre. The colour coordinates (CIE: Commission Internationale de l'Éclairage, standard observer from 1931) can be derived from the measured spectrum.

Of particular importance for the usability of materials is the lifetime of the device. This is measured in a measurement set-up which is very similar to the first evaluation by setting an initial luminous density (for example 1000 cd/m²). The current required for this luminous density is kept constant, while the voltage typically increases and the luminous density typically decreases. The lifetime has been reached when the initial luminous density has dropped to 50% of the initial value.

The results obtained on use of polymers P1 to P3 and C1 in PLEDs are summarised in Table 1.

TABLE 1

| Example | Polymer | Max. eff. [cd/A] | U @ 100 cd/m² [V] | CIE [x/y] | Lifetime [h @ cd/m²] |
|---|---|---|---|---|---|
| 7 | P1 | 8.35 | 5.29 | 0.17/0.33 | 1000 @ 1000 |
| 8 | P2 | 8.85 | 4.89 | 0.17/0.30 | 1200 @ 1000 |
| 9 | P3 | 12.09 | 4.63 | 0.19/0.36 | 1500 @ 1000 |
| 10 | C1 | 4.57 | 5.04 | 0.15/0.15 | 80 @ 1000 |

As can be seen from the results, polymers P1 to P3 represent a significant improvement in efficiency and lifetime compared with the comparative polymer. The novel polymers according to the invention are consequently significantly more suitable for use in displays and lighting applications than polymers in accordance with the prior art.

The invention claimed is:

1. An organic electronic device having one or more active layers, wherein at least one of these active layers comprises one or more polymers wherein the polymer consists of 0.01 to 50 mol % of one or more structural units of formula (I) or (II),

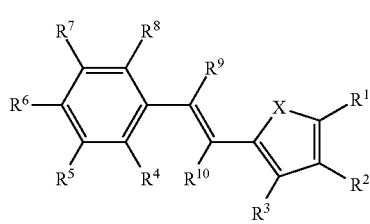

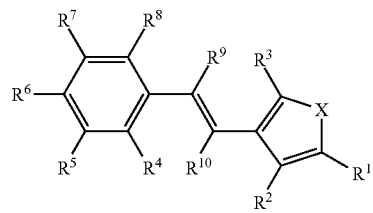

where the symbols and indices used have the following meanings:

$R^1$ to $R^{10}$ are, independently of one another, identically or differently, H, halogen (F, Cl, Br, I), —CN, —NO$_2$, —NCS, —NCO, —OCN, —SCN, —SF$_5$, —Si(R)$_3$ or a straight-chain, branched or cyclic alkyl or alkoxy group having 1 to 22 C atoms, in which, in addition, one or more non-adjacent C atoms is optionally replaced by —C(R)=C(R)—, —C≡C—, —N(R)—, —O—, —S—, —CO—, —CO—O—, —O—CO— or —O—CO—O—, where, in addition, one or more H atoms is optionally replaced by fluorine, an aryl, aryloxy, heteroaryl or heteroaryl-oxy group having 5 to 40 C atoms, which is optionally substituted by one or more non-aromatic radicals $R^{1-10}$, where, in addition, two or more radicals of the radicals $R^{1-10}$ optionally forms with one another an aliphatic or aromatic, mono- or polycyclic ring system, which optionally forms a condensed ring system with the benzene ring or the thiophene ring in the formula (I) and/or (II), R is on each occurrence, identically or differently, H, halogen, a straight-chain, branched or cyclic alkyl chain having 1 to 22 C atoms, in which, in addition, one or more non-adjacent C atoms is optionally replaced by —O—, —S—, —CO—, —CO—O—, —O—CO— or —O—CO—O—, where, in addition, one or more H atoms is optionally replaced by fluorine, an aryl, aryloxy, heteroaryl or heteroaryloxy group having 5 to 40 C atoms, which is optionally substituted by one or more non-aromatic radicals $R^{1-10}$, where, in addition, two or more radicals R may form with one another and/or with further radicals $R^{1-10}$ an aromatic or aliphatic, mono- or polycyclic ring system, which optionally forms a condensed ring system with the benzene ring or the thiophene ring in the formula (I) and/or (II), X is S or O, and structural units, which have hole-injection and/or hole-transport properties, and structural elements, which are used as backbone;

wherein the structural units, which have hole-injection and/or hole-transport properties are triarylamine and wherein the structural elements, which are used as backbone are 4,5-dihydropyrene, 4,5,9,10-tetrahydropyrene, fluorene, 9,9'-spirobifluorene, phenanthrene, 9,10-dihydrophenanthrene, 5,7-dihydrodibenzoxepine or cis- and trans-indenofluorene.

2. An organic electronic device having one or more active layers, wherein at least one of these active layers comprises one or more polymers comprising 0.01 to 100 mol % of one or more structural units of the formula (I) and/or (II):

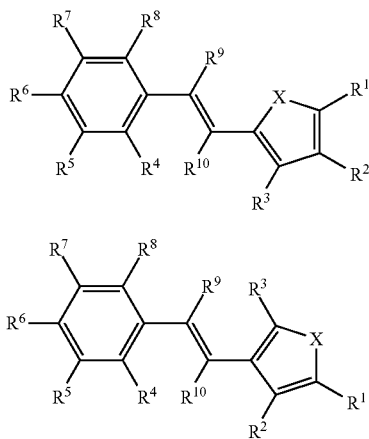

where the symbols and indices used have the following meanings:

$R^1$ to $R^{10}$ are, independently of one another, identically or differently, H, halogen (F, Cl, Br, I), —CN, —NO$_2$, —NCS, —NCO, —OCN, —SCN, —SF$_5$, —Si(R)$_3$ or a straight-chain, branched or cyclic alkyl or alkoxy group having 1 to 22 C atoms, in which, in addition, one or more non-adjacent C atoms is optionally replaced by —C(R)=C(R)—, —C≡C—, —N(R)—, —O—, —S—, —CO—, —CO—O—, —O—CO— or —O—CO—O—, where, in addition, one or more H atoms is optionally replaced by fluorine, an aryl, aryloxy, heteroaryl or heteroaryloxy group having 5 to 40 C atoms, which is optionally substituted by one or more non-aromatic radicals $R^{1-10}$, where, in addition, two or more radicals of the radicals $R^{1-10}$ optionally forms with one another an aliphatic or aromatic, mono- or polycyclic ring system, which optionally forms a condensed ring system with the benzene ring or the thiophene ring in the formula (I) and/or (II), R is on each occurrence, identically or differently, H, halogen, a straight-chain, branched or cyclic alkyl chain having 1 to 22 C atoms, in which, in addition, one or more non-adjacent C atoms is optionally replaced by —O—, —S—, —CO—, —CO—O—, —O—CO— or —O—CO—O—, where, in addition, one or more H atoms is optionally replaced by fluorine, an aryl, aryloxy, heteroaryl or heteroaryloxy group having 5 to 40 C atoms, which is optionally substituted by one or more non-aromatic radicals $R^{1-10}$, where, in addition, two or more radicals R may form with one another and/or with further radicals $R^{1-10}$ an aromatic or aliphatic, mono- or polycyclic ring system, which optionally forms a condensed ring system with the benzene ring or the thiophene ring in the formula (I) and/or (II), X is S or O, and in which at least two of the radicals $R^1$ to $R^6$ denotes a link in the polymer and in which at least one of the radicals $R^4$, $R^5$, $R^7$ and $R^8$ is an aryl, aryloxy, heteroaryl or heteroaryloxy group having 5 to 40 C-atoms, which may also be substituted by one or more non-aromatic radicals $R^{1-10}$.

3. The organic electronic device according to claim 2, wherein the device is an organic or polymeric light-emitting diode (OLED, PLED), an organic integrated circuit (O—IC), an organic field-effect transistor (OFET), an organic thin-film transistor (OTFT), an organic solar cell (O—SC), an organic laser diode (O-laser), an organic photovoltaic (OPV) element or device or an organic photoreceptor (OPC).

4. The organic device according to claim 2, which comprises further structural units besides the units of the formula (I) and/or (II).

5. The organic device according to claim 4, wherein the further structural units, which have hole-injection and/or hole-transport properties, are triarylamine, benzidine, tetraaryl-para-phenylenediamine, triarylphosphine, phenothiazine, phenoxazine, dihydrophenazine, thianthrene, dibenzopara-dioxin, phenoxathiyne, carbazole, azulene, thiophene, pyrrole or furan derivatives or further O-, S- or N-containing heterocycles having a high HOMO.

6. The organic device according to claim 4, wherein the further structural units, which have electron-injection and/or electron-transport properties, are pyridine, pyrimidine, pyridazine, pyrazine, oxadiazole, quinoline, quinoxaline, anthracene, benzanthracene, pyrene, perylene, benzimidazole, triazine, ketone, phosphine oxide, phenazine derivatives, triarylboranes or further O-, S- or N-containing heterocycles having a low LUMO.

7. The organic device according to claim 4, wherein the further structural elements modify the emission characteristics to such an extent that electrophosphorescence can be obtained instead of electrofluorescence.

8. The organic device according to claim 4, wherein the further structural elements, improve the transfer from the singlet state to the triplet state, are carbazole and bridged carbazole dimer units, ketones, phosphine oxides, sulfoxides, sulfones or silane derivatives.

9. The organic device according to claim 4, wherein the further structural elements, which influence the emission color of the polymers, are 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4"-terphenylylene, 4,4'-bi-1,1'-naphthylylene, 4,4'-tolanylene, 4,4'-stilbenzylene, 4,4"-bisstyrylarylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives.

10. The organic device according to claim 4, wherein the further structural elements, which are used as backbone, are 4,5-dihydropyrene, 4,5,9,10-tetrahydropyrene, fluorene, 9,9'-spirobifluorene, phenanthrene, 9,10-dihydro-phenanthrene, 5,7-dihydrodibenzoxepine or cis- and trans-indenofluorene derivatives.

* * * * *